United States Patent
Zhu et al.

(10) Patent No.: US 10,731,237 B1
(45) Date of Patent: Aug. 4, 2020

(54) ULTRA HIGH TEMPERATURE CERAMIC COATINGS AND CERAMIC MATRIX COMPOSITE SYSTEMS

(71) Applicant: United States of Americas as represented by the Administrator of NASA, Washington, DC (US)

(72) Inventors: Dongming Zhu, Westlake, OH (US); Janet B. Hurst, Columbia Station, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 68 days.

(21) Appl. No.: 15/713,821

(22) Filed: Sep. 25, 2017

Related U.S. Application Data (60) Provisional application No. 62/398,731, filed on Sep. 23, 2016.

(51) Int. Cl.
| | | |
|---|---|---|
| C22C 29/04 | (2006.01) | |
| C22C 27/00 | (2006.01) | |
| C23C 16/36 | (2006.01) | |
| C22C 16/00 | (2006.01) | |
| C22C 47/00 | (2006.01) | |

(52) U.S. Cl.
CPC .............. *C22C 29/04* (2013.01); *C22C 16/00* (2013.01); *C22C 27/00* (2013.01); *C23C 16/36* (2013.01); *C22C 47/00* (2013.01); *C22C 2202/00* (2013.01)

(58) Field of Classification Search
None
See application file for complete search history.

(56) References Cited

U.S. PATENT DOCUMENTS 4,984,940 A * 1/1991 Bryant ................. B23B 27/145
407/119
5,308,376 A * 5/1994 Oskarsson .............. C22C 29/04
75/230

FOREIGN PATENT DOCUMENTS

| CN | 101381836 | * | 10/2008 |
| CN | 102443772 | * | 9/2010 |
| CN | 103668105 | * | 12/2013 |
| EP | 0518840 | * | 10/1992 |
| EP | 0578031 | * | 6/1993 |
| ES | 411070 | * | 1/1976 |
| JP | 55079847 | * | 6/1980 |
| JP | 2004042193 | * | 7/2002 |
| WO | 2004104248 | * | 12/2004 |

OTHER PUBLICATIONS

Cote, M, et al. "Carbon Nitride compounds with 1:1 Stoichiometry". Physical Review B. vol. 55, No. 9. 5684-5688 (1997) (Year: 1997).*

* cited by examiner

*Primary Examiner* — Sheng H Davis
(74) *Attorney, Agent, or Firm* — Robert H. Earp, III; Helen M. Galus (57) ABSTRACT

Advanced ultra high temperature ceramic (UHTC) systems with higher temperature capabilities, particularly an integrated ceramic coating and ceramic matrix composite (ICC-CMC). Also disclosed are coating and/or ceramic matrix composites and architecture arrangements to achieve ultra-high temperature and heat flux capability, resistance to oxidation, combustion, and a wide range of spectrum wavelength and charged particle radiation environments.

11 Claims, 12 Drawing Sheets

ULTRA HIGH TEMPERATURE CERAMIC COATINGS AND CERAMIC MATRIX COMPOSITE SYSTEMS

CROSS-REFERENCE TO RELATED APPLICATIONS

This application claims the benefit of U.S. Provisional Patent Application Ser. No. 62/398,731 entitled "Ultra High Temperature Ceramic Coatings And Ceramic Matrix Composite Systems" filed on Sep. 23, 2016, the entirety of which is incorporated by reference herein.

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 U.S.C. 2457).

TECHNICAL FIELD

The general field of this innovation is coating systems for silicon-based ceramic components. The innovation also teaches novel compostions and environmentally resistant fiber-reinfored ceramic matrix composites.

BACKGROUND

Revolutionary ultra-high temperature, high mechanical loading capable, oxidation resistant, durable ceramic coatings and light-weight fiber-reinforced Ceramic Matrix Composite (CMC) systems are crucial to increase efficiency and performance of aerospace propulsion systems as well as for hypersonic vehicles and planetary entry systems. The current state-of-the-part materials include ceramic matrix composites (CMCs) and C/C$_f$ composites with application temperature on the order of 2200-3000° F. (1204-1650° C.), along with the ultra-high temperature ceramics (UHTCs), typically comprising borides, carbides and nitrides of transition elements such as hafnium, zirconium, tantalum and titanium, and the mixtures such as zirconium diboride or hafnium diboride plus silicon carbide. The materials are still largely limited in their oxidation resistance, fracture toughness and temperature capabilities. Premature failure of components due to high temperature and high heat flux may be caused by thermal oxidation, high internal thermomechanical stresses, and increased materials phase instability during the envisioned ultra-high temperature operation conditions.

Higher application temperatures are necessary for ultra-high temperature and improved durability applications, such as advanced subsonic and supersonic aircraft turbine engine hot section material systems, hypersonic propulsion engines and leading edge airframe components, and planetary entry, descending and landing (EDL) systems, Advanced materials and processing along with the high fidelity property testing and modeling are crucial for improving performance and reducing the operating costs of aerospace propulsion, energy and aerospace vehicle thermal structure and thermal protection systems (TPS). Innovative and integrated multifunctional material and structure systems define the next generation Ultra-High Temperature Ceramic and Coating (UHTCC) systems for extreme environment applications with significantly increased the temperature capability and durability beyond the current state-of-the-art CMCs and UHTCCs.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

The innovation disclosed and claimed herein, in aspects thereof, comprises systems, methods and articles that can include ultra-high temperature capable, environmental barrier coating and bond coat systems. One example article can include a substrate, such as a SiC/SiC ceramic matrix composite substrate, and a bond coat system. The bond coat system can include a bond coat that includes one or more of a silicon/silicide component or an oxide/silicate component or carbonitride component. Optionally, interlayers can be included between the substrate and bond coat and external to the bond coat, and an optional environmental barrier coating top coat can be included external to the bond coat system.

To the accomplishment of the foregoing and related ends, certain illustrative aspects of the innovation are described herein in connection with the following description and the annexed drawings. These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

BRIEF DESCRIPTION OF THE DRAWINGS

FIG. 3A illustrates an example embodiment comprising

DETAILED DESCRIPTION

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

Next generation high performance ceramic matrix composite (CMC) and coating materials will greatly rely on the discovery of new categories of refractory material systems. In many future aerospace applications, the operating temperatures are expected to exceed 1650° C. (3000° F.). Advanced space air vehicle airframe and high speed propulsion engine systems sometimes require the material and components operating temperature beyond 4000° F.

Environmental barrier coating (EBC) systems are advanced multi-component compositions arranged to form thermodynamically stable, multi-scale composites with superior temperature stability, strength, toughness, and durability. In one embodiment, the EBC system may include thin ceramic layers, generally applied by plasma spraying and/or physical vapor deposition, including Electron Beam-Physical Vapor Deposition (EB-PVD), or Plasma-Spray Physical Vapor Deposition (PS-PVD), and High temperature Vacuum Vapor Deposition, Chemical vapor Deposition, Polymer Derived Coatings and Surry coatings, that are used to protect monolithic ceramic or ceramic matrix composite (CMC) components, from high temperature, water vapor and/or other corrosive combustion gas attacks in gas turbine or other heat engines, and resistant to thermal cycling and mechanical fatigue operating conditions. Multiple passes, controlled infiltrations of specially designed compositions of polymer derived ceramics are also important processing routes for the synthesis of the ultra-high temperature ceramics, as shown in examples of FIGS. 10A, 10B and 10C.

Current high temperature SiC/SiC, or C/SiC CMCs have been processed by various approaches, typically including Chemical Vapor Infiltration of the woven fiber preforms then followed by a Melt Infiltration process or by a hybrid Chemical Vapor Infiltration+Polymer Infiltration and Pyrolysis (PIP) Process.

Advanced environmental barrier coatings with $HfO_2$, rare earth silicates, rare earth aluminate silicates, along with $HfO_2$—Si, rare earth-silicon, rare earth-silicon (+Hf) have been developed for SiC/SiC based ceramic matrix composites to achieve 2700° F.+(1482° C.+) bond coat temperature and 3000° F. (1650° C.) surface temperatures and with thin coating configurations (typically 5-10 mils, overall coating thickness 127-250 micrometers) have been disclosed previously in U.S. Pat. No. 7,740,960 and U.S. Patent Application Pub. No. 2013/0344319, both of which are incorporated herein in their entirety.

The ultra-high temperature materials according to the innovation further increases material temperature capabilities beyond the capabilities of current rare earth-hafnium silicon, silicides, oxide-silicide, SiC, or C composites in extreme environments. Advanced architectures utilizing the ultra-high temperature materials of the innovation also achieve superior performance.

In various aspects, embodiments of the subject innovation can include systems, articles, and methods that employ ultra-high temperature materials. In one aspect, the ultra-high temperature materials may be utilized in an advanced high temperature capable, low expansion and low diffusion environmental barrier coating (EBC) bond coat system for Si-based ceramics and ceramic matrix composites (CMCs), as diffusion barriers.

The innovation provides novel ultra-high temperature ceramics and coating materials (collectively, the ultra-high temperature materials). According to an aspect of the innovation, the ultra-high temperature material may comprise a HfCN or ZrCN coating. In one embodiment, the ultra-high temperature material is a part of a (Hf, Zr, Ta)RESiCN system, where RE refers to Rare Earth metals that can be employed in connection with group A include ytterbium, gadolinium, neodymium, samarium, lutetium, erbium, europium, terbium, dysprosium, holmium, lanthanum, cerium, praseodymium, promethium, thulium (i.e., lanthanides), plus Yttrium and Scandium, in this carbonitride category systems. The HfCN or ZrCN coating may be combined with the (Hf, Zr, Ta)RESiCN system to achieve high temperature noncrystalline stability with low oxygen and moisture diffusivity and permeability significantly beyond the state of the art.

In one embodiment, the innovation provides an environmental barrier coating (EBC) system or a component or components of such an EBC system. the ultra-high temperature ceramic EBC system may include a ceramic matrix composite or carbon/carbon composite (e.g., SiC/SiC, C/SiC, or C/C composites); a bond coat, and a ceramic coating.

According to an aspect of the innovation, the ultra-high temperature material is a constituent of an ultra-high temperature ceramic matrix composite such as silicon carbide fiber/silicon carbide, carbon fiber/silicon carbide or carbon fiber/carbon composite. The ceramic matrix composite may comprise turbine engine hot section components such as turbine vanes and blades, or combustors, utilizing HfSiRECN or SiHfRECN as matrix materials, fiber coatings, and or advanced fibers. The carbon/carbon composite may be utilized in various components, including, but not limited to space craft wing leading edges and or nose cone components.

Figure 7A:
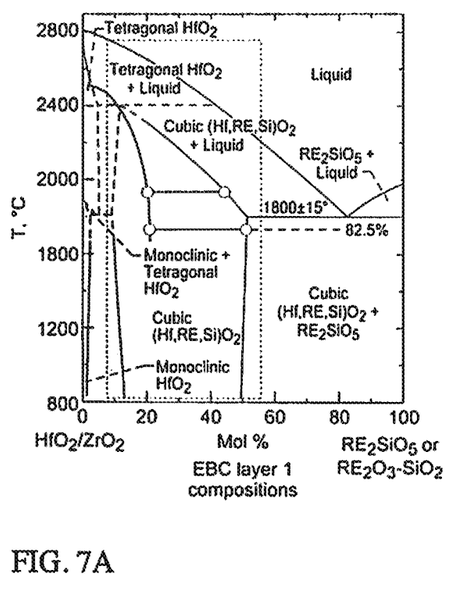
FIGS. 7A and 7B are phase diagrams of $HfO_2/ZrO_2$-RE silicate systems for ultra-high temperature and low diffusion UHTC scale composite designs.
Figure 7B:
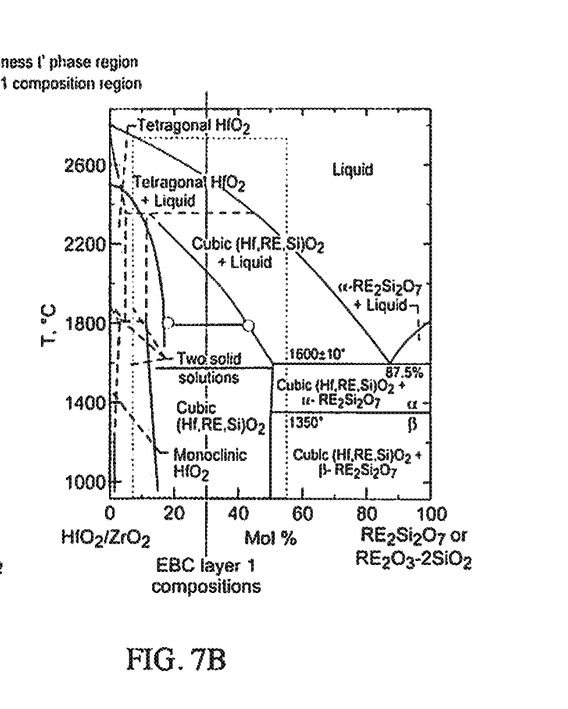

According to an aspect of the innovation, the ultra-high temperature ceramic or material may form protective scales. The protective scales that are designed into the ultra-high temperature material compositions. These protective scales are self-grown, and slow-growing, including hafnium rare earth oxide silicates, hafnium rare earth oxycarbonitride silicates, as shown in FIGS. 7A and 7B.

In one embodiment, the ultra-high temperature material comprises an ultra-high temperature ceramic hafnium-nitrogen-carbide alloy. In one embodiment, the hafnium-nitrogen-carbide alloy comprises preferably hafnium balance, carbon ranging from 30 at % to 60 at %, nitrogen ranging from 2 at % to 40 at %, and C+N ranging from 30 to 50 at %. An example of the alloy composition Hf-27 at. % C-20 at. % N.

According to an aspect of the innovation, the ultra-high temperature material may be incorporated in alternating layered architectures wherein the layers comprise ultra-high melting point compositions of HfCN or ZrCN. In one embodiment, the ultra-high temperature material may comprise alternating layered coating and composites comprising HfCN or ZrCN. In one embodiment, the alternating layered architecture is on SiC/SiC or C/SiC composite substrates or components. In another embodiment, the substrate or component may comprise a C/C or C/SiC composite. Other suitable substrates include MAX phase $Ti_2SiC$; $Ti_2AlC$; or Titanium-Zirconium-Carbonitride, Titanium-Hafnium-Carbonitride, Titanium-Zirconium-Boride and Titanium-Hafnium-Boride alloys.

In one embodiment, the layered architectures may be on a (Hf,Zr,Ta)RESiCN substrate and may be arranged in any suitable manner. One example of a layered arrangement is. HfCN (or ZrCN)/Hf(RESi)CN/HfCN (or ZrCN)/Hf(RESi)CN/HfCN (or ZrCN).

In one embodiment, Hf(RESi) silicide systems may be incorporated into the alternating structures. For example, HfCN (or ZrCN)/Hf(RESi)/HfCN (or ZrCN)/Hf(RESi)/HfCN (or ZrCN).

In yet another embodiment, (Hf,Ta)RESiCN systems may be incorporated into the alternating structures. For example, HfCN (or ZrCN)/(Hf,Ta)RESiCN/HfCN (or ZrCN)/(Hf,Ta)RESiCN/HfCN (or ZrCN) or HfCN (or ZrCN)/TaRESiCN/HfCN (or ZrCN)/TaRESiCN/HfCN (or ZrCN).

In another embodiment, the composite coatings and composites can also be incorporated with Si(Hf)BCN—HfCN or Si(Hf)BCN—ZrCN. For example, HfCN (or ZrCN)/Si(Hf)BCN/HfCN (or ZrCN)/Si(Hf)BCN/HfCN (or ZrCN).

The composite coatings and composites can also be incorporated within doped alloyed composition clustering forms. Composition clustering forms may comprise hafnium silicides, zirconium silicides, tantalum silicides, titanium silicides, such as $Hf_2Si$, $Hf_5Si_3$, $HfSi$; $Zr_2Si$, $Zr_5Si_3$, $ZrSi$; $Ta_2Si$, $Ta_5Si_3$, $TaSi$, $TaSi_2$; $Ti_5Si_3$, $Ti_5Si_4$, $Ti\,Si$; and the Silicide-B—C—N solid solutions with high temperature thermodynamically stable multicomponent metal silicide-carbo-nitride or boride phases including $D8_8$ phases.

In an embodiment, the innovation may include additional dopant elements to the HfCN and ZrCN composite and/or composite coatings, including rare earth (RE, and Y, Sc), Si, B, Al to form (Hf,Zr,Si)CN, (Hf,Zr,Si)RECN, (Hf,Zr,Si)REBCN and $(Hf,Zr,Si)REB_2$, that forming oxidation resistant and protective scales In another embodiment, the innovation provides the particulate composites of the various cluster dopant elements and their carbonitrides or boron carbonitrides to improve temperature capability, oxidation resistance and thermosmechanical performance.

In one embodiment, the doped or layered HfCN(or ZrCN)—Hf(RE,Si,B)CN maybe incorporated with aligned long or short SiC, doped SiC or C nanofibers to form Ultra-High Temperature Ceramic Matrix Composites (UHTCMCs).

In another embodiment, the HfCN(or ZrCN)—Hf(RE,Si,B)CN may be a coating or composite matrix, into which oxygen or metal $HfO_2$ or $RE_2O_3$ oxides may be incorporated. In one embodiment, the Si, B content may be modified to achieve properties as an electrical insulators or electrical conductors, with low thermal conductivity or high thermal conductivity.

According to an aspect, the innovation provides an advanced ultra high temperature ceramic (UHTC) system that includes an integrated ceramic coating and ceramic matrix composite (ICC-CMC) that utilizes the ultra-high HfCN or ZrCN material to significantly improve temperature capability. The material melting point may be over 4100° C. with appropriate compositions. In one embodiment, Si and/or B related alloying components may be included for further improved oxidation resistance, erosion and impact resistance.

In one embodiment, the ICC-CMC may be expanded to integrated CMC systems, by integrating the HfCN (or ZrCN) material, and by using a concept of alternating layered HfCN—(Hf)SiBCN and HfCN—(Hf,Ta)RESiCN, in conjunction with interface diffusional and compatibility layer coating systems. Advanced dopants such as t' rare earth doped $ZrO_2$ or $HfO_2$, may also be incorporated to further strength and toughen coating or composite systems.

In one embodiment, alloyed HfCN—(Hf)SiBCN and HfCN—(Hf,Ta)RESiCN systems may be used to achieve high temperature noncrystalline stability significantly beyond state of the art. Nanofibers or nanotubes may be integrated integrating to achieve lightweight ultrahigh temperature composites with high strength and high thermal and electrical conductivities. It is to be understood that while the systems and composites of the innovation have ultra-high temperature capabilities, the systems and composites may also be used in non-ultra-high temperature applications, such as turbine engine component environmental barrier coatings. For example, the systems and composites can be used to from self-grown protective scales, containing silicon or metal oxynitride phases. In these applications, addition of N, or metal nitrides only compositions (such as HfN, HfSiN, HfRESiN) may have reduced temperature capabilities as compared to carbonitrides, but nitrogen containing compositions may stabilize scales for improved oxidation resistance as compared to carbide-only based compositions.

According to an aspect, the innovation provides highly stable bond coat systems for SiC/SiC CMC components comprising a multi-component, alloy doped silicon, alloy-doped and silicon-rich rare earth (RE) silicides, rare earth (RE) doped transition metal silicides, and nitrogen, boron and carbon doped metal silicon alloy and compounds. In one embodiment, the compounds may also include advanced oxides and silicates such as hafnium rare earth silicates or hafnium rare earth silicon oxycarbinitrides (Hf,RE)(Si,C,N,O).

In one embodiment, the composites and the main constituent Hf— or Zr—CN, may be doped with high melting point rare earth doped or alloyed silicon; and/or rare earth (RE) silicides (various stoichiometry compounds, $RE_5Si_3$, $RE_5Si_4$, $RESi$, $RE_3Si_5$, $RESi_2$, which include ytterbium silicides, yttrium silicides, gadolinium silicides, erbium silicides, etc); rare earth (RE) silicides doped with zirconium, hafnium, aluminum and a combination of thereof; rare earth (RE) doped refractory transition metal silicides, which include rare earth (RE) doped or alloyed zirconium silicides, hafnium silicides, tantalum silicides, titanium silicides, chromium silicides, iron silicides, molybdenum silicides, niobium silicides and aluminum silicides; rare earth (RE) and aluminum doped palladium, iridium and platinum silicides; rare earth (RE) doped or non-doped tantalum-, titanium-, chromium-, molybdenum-, niobium-, aluminum-silicon carbon, boron, nitride; and compounds with silicon, such as $Ti_x(AlCrTa)_ySi$—CN, $Ti_x(AlCrTa)_ySi$—BN, $Ti_2CrTa(Si)$—N, ZrTaSi—N and $Ta_2AlSi$—CN; and a combination of two or more thereof.

The coating with composite compositions may have a layer thickness (or alternating layer thickness) of from about 0.1 micrometers to about 1.0 mm.

In one embodiment, the coating composition and composites of the innovation may utilize hybrid compositions including hafnium carbonitrides (Hf(X)CN) or zirconium carbonitrides (Zr(X)CN), where X is Si, Al, 0, or other dopants. These compositions and/or composites may also be combined with doped refractory carbonitrides, refractory silicides, or refractory oxides to enhance temperature capability and durability in extreme environments.

The UHTC ICC-CMC of the innovation can be used in various aero and space high temperature applications, including new generation CMC turbine engine combustor liners and vanes, turbine blades, and space vehicles airframes and propulsion engines. For example, use of the compositions and composites of the innovation will allow engines to be operated at much higher temperatures with significantly reduced cooling. This technology can be also used in power generation and other energy rated heat engine systems, and, for example, space systems with strong solar radiations.

Figure 1:
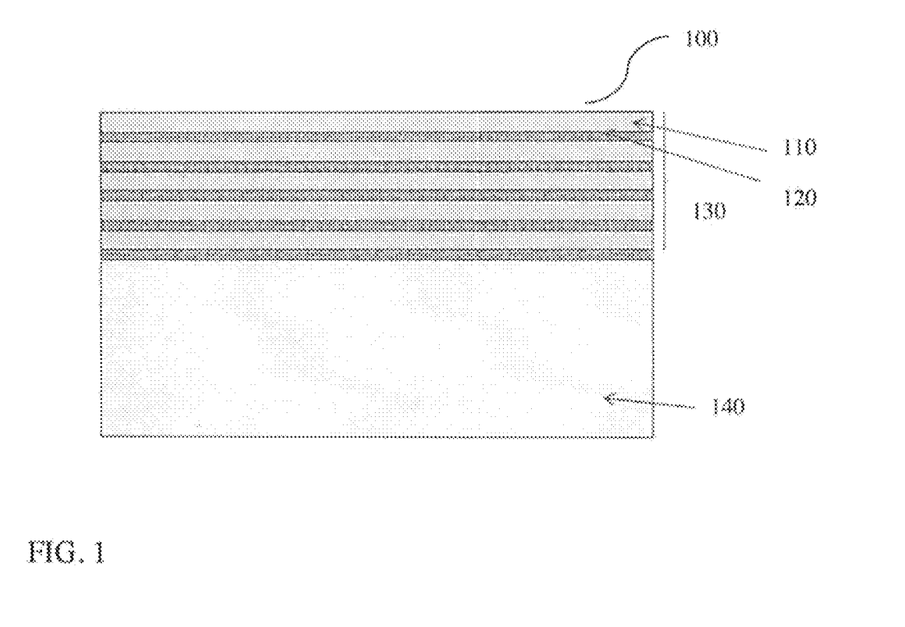
FIG. 1 illustrates a first example of a coating system according to the innovation.

Referring initially to the drawings, FIG. 1 illustrates a first example of a coating system 100 according to an embodiment of the innovation. This embodiment is an alternating layered coating system on a SiC/SiC, C/SiC composite. The coating system 100 may, for example, include doped and undoped HfCN and Si(Hf)BCN alternating layers. Such a configuration allows for up to 4000° F. surface temperature capability and improved multifunctional performance. In one embodiment, a first layer 110 comprises HfCN and a second layer 120 comprises Si(Hf)BCN. Alternating layers 130 are utilized as a coating for a SiC/SiC or C/SiC CMCs or C/C substrate 140. In one embodiment, the coating system 100 is an alternating layered HfCN+Si(Hf)BCN coating system on SiC/SiC, C/SiC composites 140. It is appreciated that the coating system may include alternating layers of HfCN or ZrCN, or any other ultra-high temperature material as set forth herein. The alternating layers provide multifunctional coatings that include improved temperature capabilities, oxidation and erosion resistance, crystallinity, and interdiffusional barrier properties. Surface temperature capability may surpass 4000° F.

The coating system 100 may comprise processed HfCN—Si(Hf)BCN alternating layers for multifunctional coatings, including temperature capability, oxidation and erosion resistance, crystallinity, and interdiffusional barrier properties.

Figure 2:
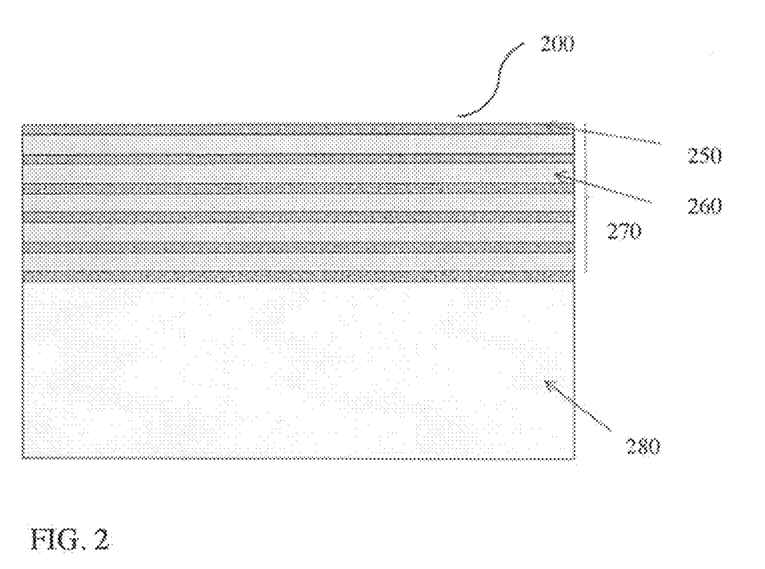
FIG. 2 illustrates a second example of a coating system according to the innovation.

FIG. 2 illustrates a second example of a coating system according to the innovation. In one embodiment, the coating system 200 may, for example, include doped and undoped HfCN and Si(Hf)BCN and HfCN+Hf(RESi)CN and HfCN+TaRESiCN alternating layers. Such a configuration allows for up to 4000° F. surface temperature capability and improved multifunctional performance. In one embodiment, a first layer 250 comprises Hf(RESi), Hf(RESi)CN, or TaRESiCN and a second layer 260 comprises HfCN. Alternating layers 270 are utilized as a coating for a SiC/SiC or C/SiC CMCs or C/C substrate 280. In one embodiment, the coating system 200 is an alternating layered HfCN+Hf(RE)Si, HfCN+Hf(RESi)CN and HfCN+TaRESiCN coating system on SiC/SiC, C/SiC composites. It is appreciated that the coating system may include alternating layers of HfCN or ZrCN, or any other ultra-high temperature material as set forth herein. The alternating layers provide multifunctional coatings that include improved temperature capabilities, oxidation and erosion resistance, crystallinity, and interdiffusional barrier properties. Surface temperature capability may surpass 4000° F.

Figure 3A:
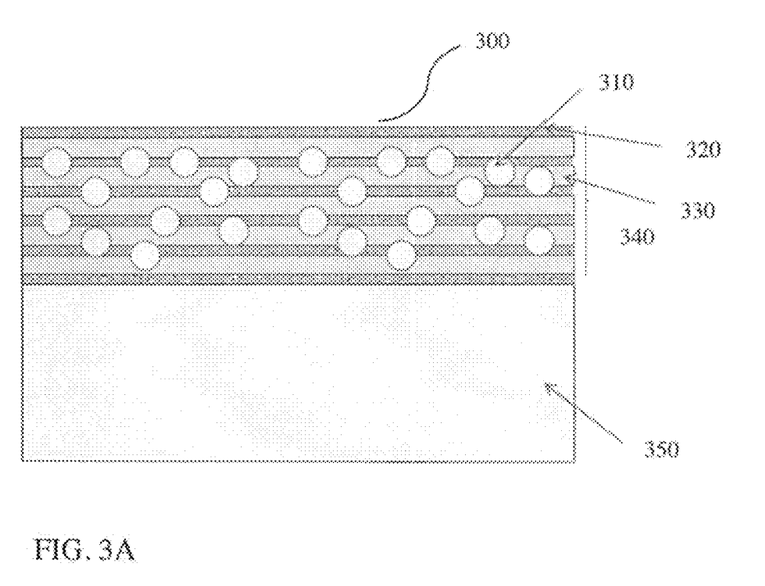
FIGS. 3A and 3B illustrate examples of a coating system according to the innovation.

FIG. 3A illustrates an example of a coating system according to the innovation. In one embodiment, the coating system 300 is on SiC/SiC, C/SiC composites 350 with $HfO_2$ or $ZrO2$, rare earth oxide clusters 310 and may include doped and undoped HfCN and Si(Hf)BCN and HfCN+Hf(RESi)CN and HfCN+TaRESiCN alternating layers. Such a configuration allows for up to 4000° F. surface temperature capability and improved multifunctional performance. In one embodiment, a first layer 320 comprises Hf(RESi), Hf(RESi)CN, or TaRESiCN and a second layer 330 comprises HfCN. Alternating layers 340 are utilized as a coating for a SiC/SiC or C/SiC CMCs or C/C substrate 350. In one embodiment, the coating system 300 is an alternating layered HfCN+Hf(RE)Si, HfCN+Hf(RESi)CN and HfCN+TaRESiCN coating system on SiC/SiC, C/SiC composites. It is appreciated that the coating system may include alternating layers of HfCN or ZrCN, or any other ultra-high temperature material as set forth herein. The alternating layers provide multifunctional coatings that include improved temperature capabilities, oxidation and erosion resistance, crystallinity, and interdiffusional barrier properties. Surface temperature capability may surpass 4000° F.

Figure 3B:
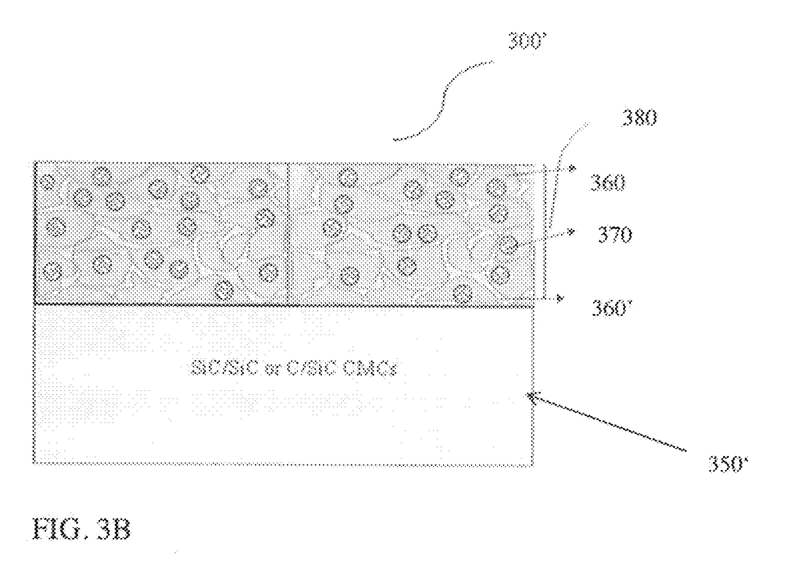

FIG. 3B illustrates an example of a UHTCC 380 according to the innovation. In an example embodiment, the coating system 300' is on SiC/SiC, C/SiC CMCs 350' and has hafnium based Hf(B)CN and/or Ta, Ti, and/or carbonitrides matrix grains 360 with nanocluster sized doped silicide or silicate nanoclusters 370. In one embodiment, the composition of the grain boundary phases includes lower carbon and nitrogen content and higher silicon and boron content. These compositions result in improved temperature capability, toughness, thermomechanical stress resistance, and durability performance.

In one embodiment, the matrix grains comprise Hf(B)CN, TaHf(B)CN, HfTi(B)CN, or ZrTi(B)CN. In one embodiment the nanoclusters may comprise HfRESi(O), ZrRESi(O), Hf(RESi)B, or Zr(RESi)B clusters. In another embodiment, the coating system may comprising HfRESi(CN), ZrRESi(CN), Hf(RESi)B(CN), ZR(RESi)B(CN) for grain boundary phases to achieve high performance ultra-high temperature ceramic and coating (UHTCC) composites.

According to an aspect of the innovation, the coating system may include cluster dopants (e.g., rare earth) 310. The rare earth and $SiO_2$ dopants can also be graded in order to maximize the coating surface temperature capabilities.

Figure 4:
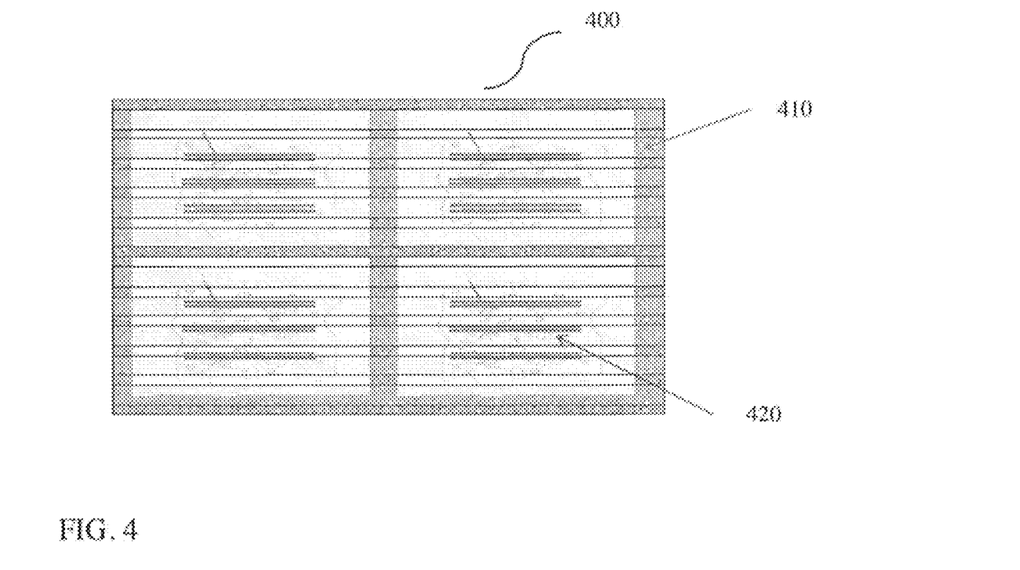
FIG. 4 illustrates an embodiment comprising matrix and composite comprising according to the innovation.

FIG. 4 illustrates an embodiment comprising doped and undoped HfCN and HfRESiCN alternating layers and incorporated fiber composites for improved temperature capability and performance.

Figure 5A:
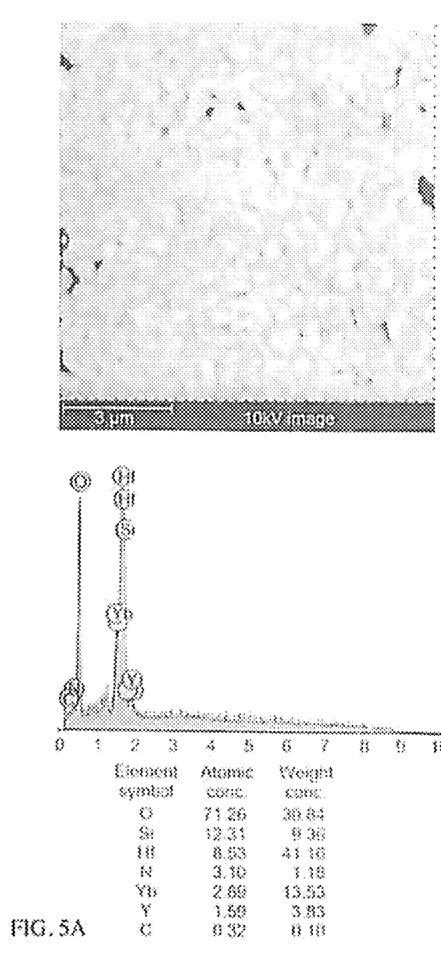
FIGS. 5A-5D depict example compositions and analyses thereof.
Figure 5B:
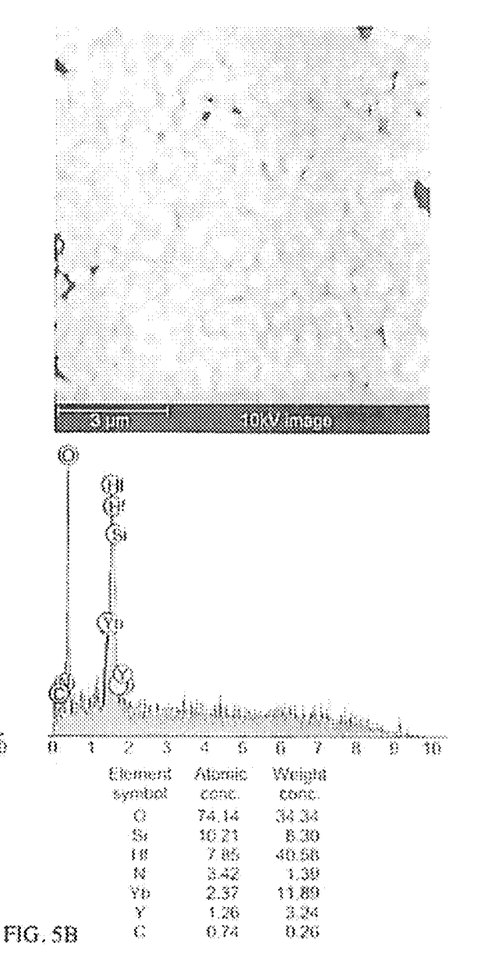
Figure 5C:
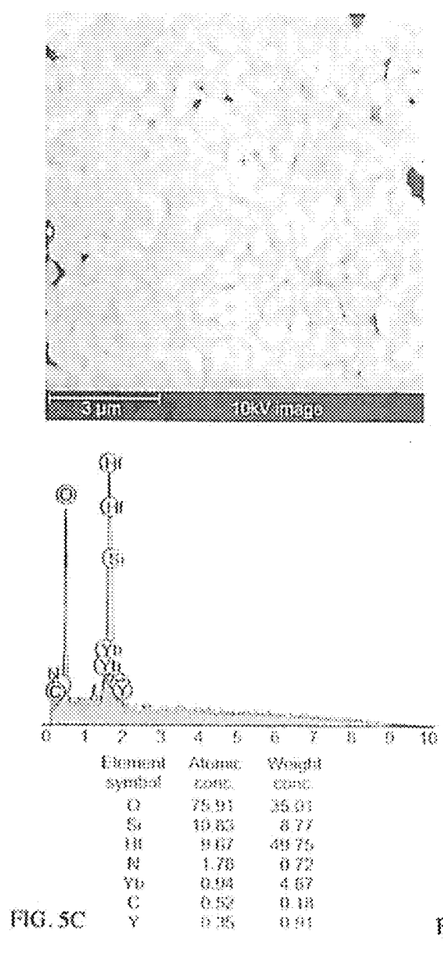
Figure 5D:
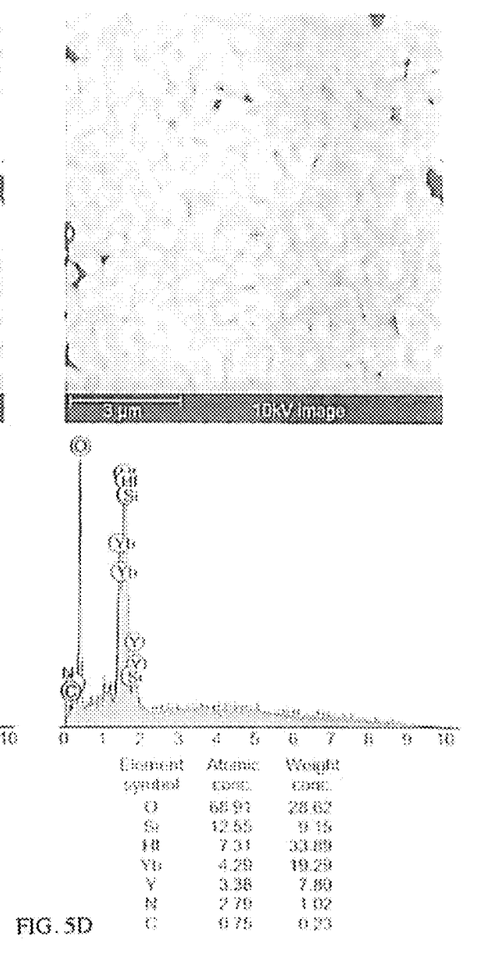

FIGS. 5A-5D depict the composition and analysis of an example embodiments according to the innovation. Each figure includes an SEM image from hafnium rare earth silicate oxide scale formation on a HfSiYYbCN UHTCC after 100 hr oxidation test in pure flowing oxygen and an energy dispersive spectroscopy (EDS) composition analysis of each composition analysis area. FIG. 5A is an overall area composition analysis; and FIG. 5B, 5C, 5D are bright or dark grains with the composition variations, primarily with the bright grains corresponding to high hafnium concentrations.

Figure 6:
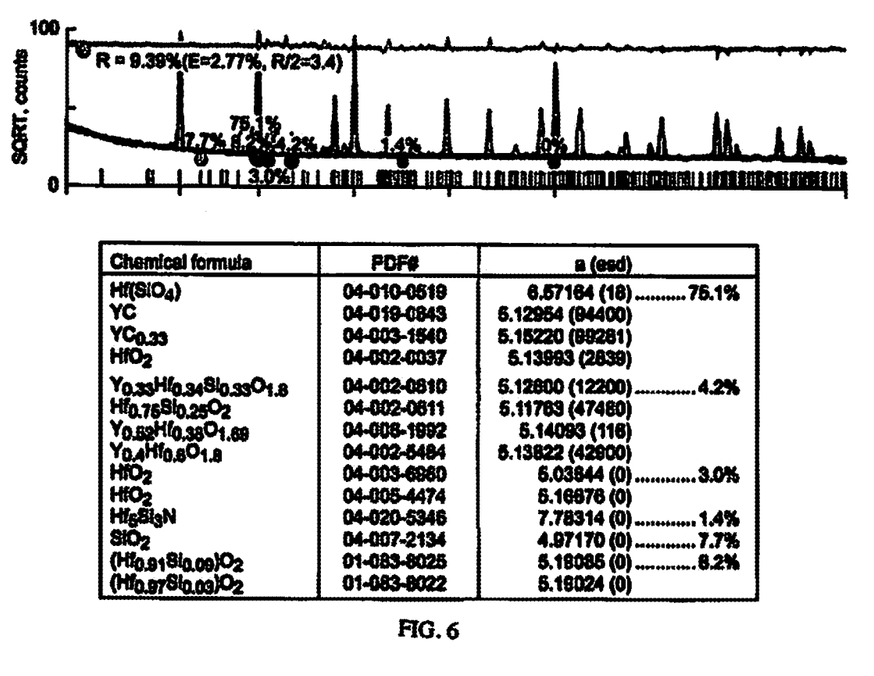
FIG. 6 is depicts an x-ray diffraction of a composition according to the innovation after 100 h oxidation at 1500° C. om flowing oxygen.

FIG. 6 depicts X-ray diffraction of HfSiYYbCN UHTCC after 100 h oxidation at 1500° C. in flowing oxygen. The rare earth (e.g., RE or Y,Yb) doped $HfSiO_4$, and in particular, rare earth doped hafnium rich silicates such as $(YYb)_{r1} Hf_{r2}Si_{r3}O_{2-x}$ and silica (or silicon) doped $HfO_2$ such as $(Hf_{0.91}Si_{0.09})O_2$ may be formed on the HfSiYYbCN UHTCC.

FIGS. 7A and 7B depict $HfO_2/ZrO_2$-RE silicate systems for ultra-high temperature and low diffusion UHTCC scale composition designs. The scales designed with Rare earths and silica doped $HfO_2$ or $ZrO_2$ are expected to include high toughness cluster t' phase toughened hafnium oxides and hafnium silicates, and hafnium rare earth silicate composition systems, thus with high environmental stability, low diffusivity, high strength, low thermal expansion coefficients matching with the UHTCC substrates. The phase compositions with clustered co-doped $HfO_2$ and rare earth monosilicate will have higher temperature capability and stability, and also with excellent CMAS resistance.

Figure 8:
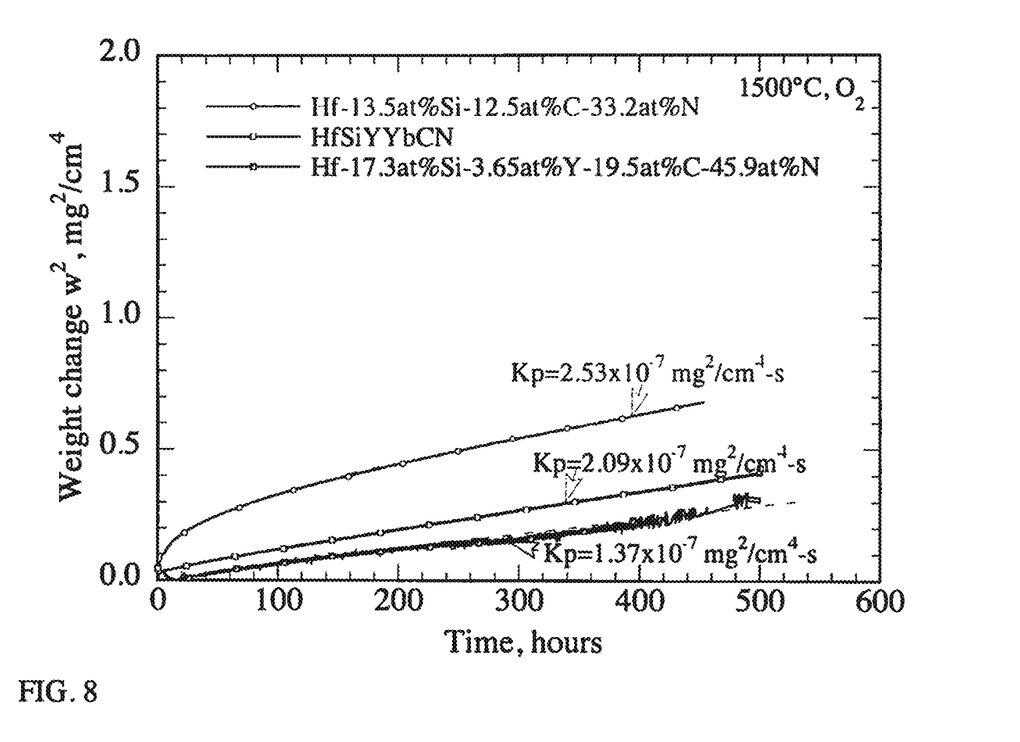
FIG. 8 is a graph depicting oxidation kinetics of example embodiments according to the innovation.
Figure 9:
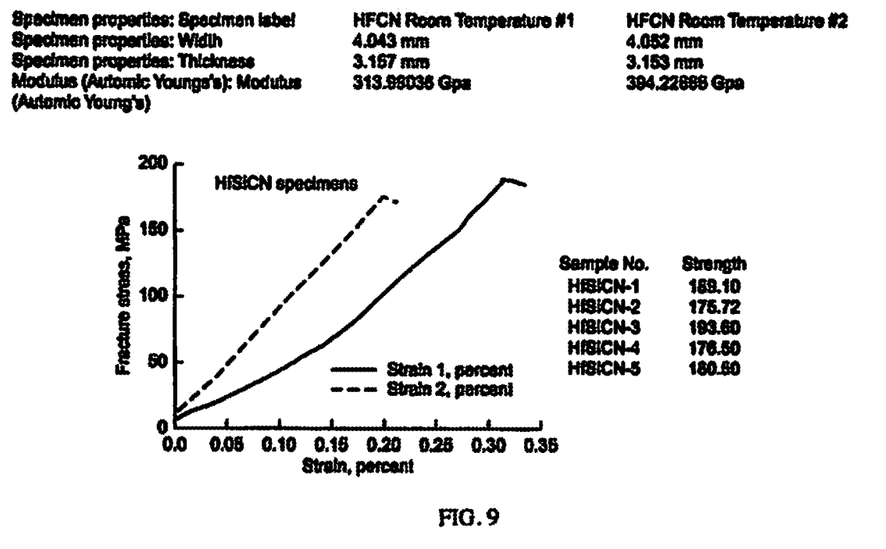
FIG. 9 is a graph depicting the results of testing of HfCN bulk material according to an example embodiment of the innovation.

Examples of oxidation kinetics of various embodiments of the innovation are depicts in the graph of FIG. 8. Examples of oxidation kinetics of HfSiCN or HfSiRESiCN in pure oxygen at 1500° C. are depicted. The rare earth doped HfSiCN showed improved oxidation resistance and better initial parabolic oxidation behavior compared to HfSiCN FIG. 9 depicts the results of room temperature fast flexural strength testing of HfCN bulk material (15-20% porosity, specimen dimension ¾×50 mm), using ASTM standard ASTM C1161. The flexure strength of the HfCN bulk material measured 183 MPa and the Young's modulus measured 354.1 GPa.

Figure 10:
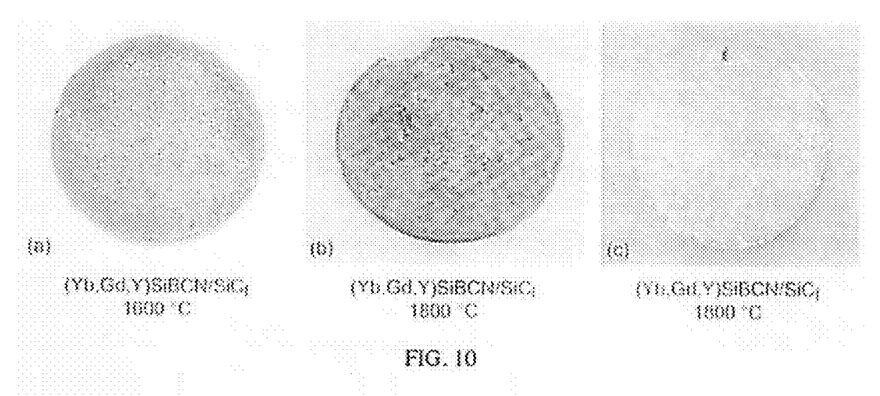
FIGS. 10A-10C are photographs of three different complex UHTCC compositions according to example embodiments of the innovation.

FIGS. 10A, 10B, and 10C are photographs of three different complex UHTCC compositions according to the innovation. The photographs depict integrated (Yb, Gd, Y)SiBCN/SiC, CMC series discs processed using combined polymer derived ceramic-hot press processing at 1600-1800° C. In one embodiment, the composites may be integrated (Yb,Gd,Y)SiBCN/SiCf, (Yb,Gd,Y)SiAlCN/SiCf and (Yb,Gd,Y)SiC/SiCf series composites.

Figure 11A:
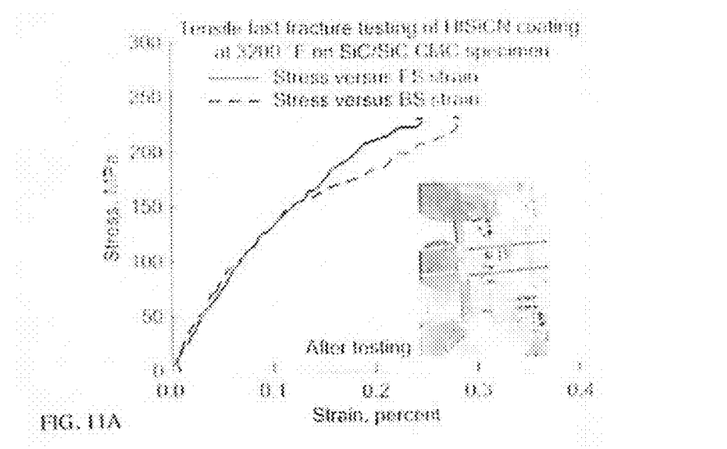
FIGS. 11A and 11B are graph depicting the results of testing of two different example embodiments of the innovation.
Figure 11B:
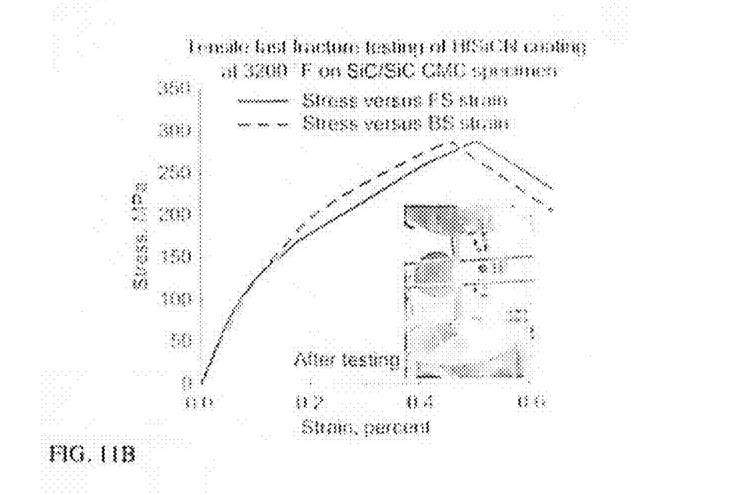

FIGS. 11A and 11B are graphs showing the results of two advanced HfSiCN coated SiC/SiC specimens according to an aspect of the innovation. Tensile fast fracture testing was performed on the coating at 3000° F.+ laser high heat flux rig tests in air on SiC/SiC CMC specimen. (a) Hf-17.3 at % Si3.65 at % Y-19.5 at % C-45.9 at % N; (b) Hf-13.5 at % Si-12.5 at % C-33.2 at % N. The yttrium doped composition showed improved adhesion from the fast strength test compared to the undoped HfSiCN.

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An ultra-high temperature material comprising:
a first layer comprising an alloy, wherein the alloy is a hafnium-carbonitride alloy, a zirconium-carbonitride alloy, or a combination of a hafnium-nitrogen-carbon alloy and a zirconium-nitrogen-carbon alloy, wherein, in the alloy, the nitrogen is present in the alloy an amount in a range of 2 at % to 40 at %, carbon is present in amount in a range of 30 at % to 60 at %, with the balance being either hafnium or zirconium;
a second layer disposed directly on the first layer, the second layer comprising a compound selected from Hf(RESi), Hf(RESi)CN, Zr(RESi), Zr(RESi)CN, TaRESiCN, or a combination of two or more thereof, wherein the material is disposed on a substrate, wherein the first and second layers extend parallel to one another in a direction substantially parallel to the substrate, wherein the second layer has a composition that is different from the first layer; and
wherein the alloy is doped with a silicide selected from a rare earth (RE) silicide, a rare earth (RE) silicide doped with zirconium, hafnium, aluminum, or a combination thereof; a rare earth (RE) doped refractory transition metal silicide, or a rare earth (RE) and aluminum doped palladium, iridium and platinum silicide; or a combination of two or more thereof.

2. The ultra-high temperature material of claim 1, wherein the first layer alloy is selected from HfCN, HfSiCN, HfSiRECN, HfSiYCN, ZrCN, ZrSiCN, ZRSiRECN, ZRSiYCN, or a combination of two or more thereof.

3. The ultra-high temperature material of claim 1, wherein, the silicide is the rare earth silicide doped with zirconium, hafnium, aluminum, or a combination thereof, wherein the rare earth silicide is selected from a ytterbium silicide, a yttrium silicide, a gadolinium silicide, an erbium silicide, or a combination of two or more thereof.

4. The ultra-high temperature material of claim 1, wherein the silicide is the rare earth doped refractory transition metal silicide, wherein the rare earth doped refractory transition metal silicide is selected from rare earth (RE) doped or alloyed zirconium silicides, hafnium silicides, tantalum silicides, titanium silicides, chromium silicides, iron silicides, molybdenum silicides, niobium silicides, aluminum silicides, or a combination of two or more thereof.

5. The ultra-high temperature material of claim 1, wherein the alloy is doped with a rare earth (RE) doped or non-doped tantalum-, titanium-, chromium-, molybdenum-, niobium-, aluminum-silicon carbon, boron, nitride; $Ti_x(AlCrTa)_ySi$—CN, $Ti_x(AlCrTa)_ySi$—BN, $Ti_2CrTa(Si)$—N, ZrTaSi—N, $Ta_2AlSi$—CN, or a combination of two or more thereof.

6. The ultra-high temperature material of claim 1, wherein the first layer comprises HfCN or ZrCN.

7. The ultra-high temperature material of claim 1, wherein the substrate is a SiC/SiC or C/SiC CMCs or C/C substrate.

8. The ultra-high temperature material of claim 1, further comprising nanoclusters of doped silicide or silicate interspersed among the first and second layers.

9. The ultra-high temperature material of claim 8, wherein the nanoclusters comprise HfRESi(O), ZrRESi(O), Hf(RESi)B, Zr(RESi)B, or a combination of two or more thereof.

10. The ultra-high temperature material of claim 1, wherein the material further comprises matrix grains comprising Hf(B)CN, TaHf(B)CN, HfTi(B)CN, ZrTi(B)CN, or a combination of two or more thereof.

11. The ultra-high temperature material of claim 1, wherein the first layer alloy is HfSiRECN.

* * * * *